(12) United States Patent
Ku et al.

(10) Patent No.: US 7,995,878 B2
(45) Date of Patent: Aug. 9, 2011

(54) INTEGRATED OPTICAL MEMORY

(75) Inventors: Pei-Cheng Ku, Ann Arbor, MI (US);
Yin-Ting Yeh, Taipei (TW)

(73) Assignee: The Regents Of The Univeristy Of Michigan, Ann Arbor, MI (US)

( * ) Notice: Subject to any disclaimer, the term of this patent is extended or adjusted under 35 U.S.C. 154(b) by 420 days.

(21) Appl. No.: 12/193,257

(22) Filed: Aug. 18, 2008

(65) Prior Publication Data

US 2009/0052297 A1 Feb. 26, 2009

Related U.S. Application Data

(60) Provisional application No. 60/956,193, filed on Aug. 16, 2007.

(51) Int. Cl.
*G02B 6/12* (2006.01)
*G11B 7/00* (2006.01)

(52) U.S. Cl. ............ 385/14; 385/15; 385/31; 385/33; 385/122; 385/141; 369/100

(58) Field of Classification Search .......... 385/14, 385/31, 33, 1, 2, 3, 129, 130, 131, 132, 141, 385/15, 16, 122; 369/100
See application file for complete search history.

(56) References Cited

U.S. PATENT DOCUMENTS

| | | | | |
|---|---|---|---|---|
| 3,566,383 | A | * | 2/1971 | Smith ............... 365/122 |
| 3,801,824 | A | * | 4/1974 | Eastwood et al. ........ 369/99 |
| 3,829,847 | A | * | 8/1974 | Masi ................ 365/112 |
| 5,896,005 | A | * | 4/1999 | Gurvitch et al. ........ 313/498 |
| 2005/0175822 | A1 | * | 8/2005 | Ohno et al. ........... 428/195.1 |
| 2008/0117662 | A1 | * | 5/2008 | Ramaraju ............. 365/106 |
| 2009/0052297 | A1 | * | 2/2009 | Ku et al. .............. 369/100 |

* cited by examiner

*Primary Examiner* — Brian M Healy
(74) *Attorney, Agent, or Firm* — Harness, Dickey & Pierce, P.L.C.

(57) ABSTRACT

An optical memory includes an array of optical material and a beam scanning device. The optical material assumes first and second states, and incident light causes the optical material to transition from the first state to the second state. The beam scanning device selectively directs a received optical data signal across the array of optical material.

21 Claims, 8 Drawing Sheets

| Clock Cycle | Operation |
|---|---|
| 1 | A, B → ÷2 → NOM 1; C → NOM 2 |
| 2 | Idle |
| 3 | Probe A⊗B → NOM 1 → NOM 2 |
| 4 | Idle |
| 5 | NOM 1; Probe A⊗B⊕C → NOM 2 |

"AND" → "OR" Operation

INTEGRATED OPTICAL MEMORY

CROSS-REFERENCE TO RELATED APPLICATIONS

This application claims the benefit of U.S. Provisional Application No. 60/956,193, filed on Aug. 16, 2007. The entire disclosure of the above application is incorporated herein by reference.

FIELD

The present disclosure relates to optical storage devices, and more particularly to methods of operating and systems of optical memory.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The speed of optoelectronic devices has increased by several orders of magnitudes during the last few decades and has surpassed the top speed of electronic circuits. Despite the ability to carry more than 1 Terabit-per-second of information with optical waves and a potential bandwidth greater than 1 THz, fundamental limitations of signal storage and processing in the optical domain have restricted the use of high speed optoelectronic devices. Signal storage and processing in the optical domain may simplify optical system architectures and enable higher speed. With the current device architectures, slower-speed electronics and complex optical electrical-optical (O/E/O) conversion are required to perform computation.

Despite the development of several all-optical logic gate architectures, the lack of a practical optical information storage technology makes sequential binary operations using these devices very difficult and thus severely limits the computational scaling capability. Although a variety of techniques including fiber optic loop, slow light, and nonlinear photonic crystal have been proposed to achieve optical information storage, these devices are either too bulky or hard to scale to the desired capacity.

For example, there is a fundamental bandwidth-delay product tradeoff for slow-light-based optical information storage, which in many cases will limit the storage capacity to only a few digital bits. Although it is possible to increase the storage capacity by using parallel device connections or a multi-spectral component pump source, these approaches are themselves very complicated and challenging.

SUMMARY

According to the principles of the present disclosure, an optical memory includes an array of optical material and a beam scanning device. The optical material assumes first and second states, and incident light causes the optical material to transition from the first state to the second state. The beam scanning device selectively directs a received optical data signal across the array of optical material.

Further areas of applicability of the present disclosure will become apparent from the detailed description, the claims and the drawings. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1A:
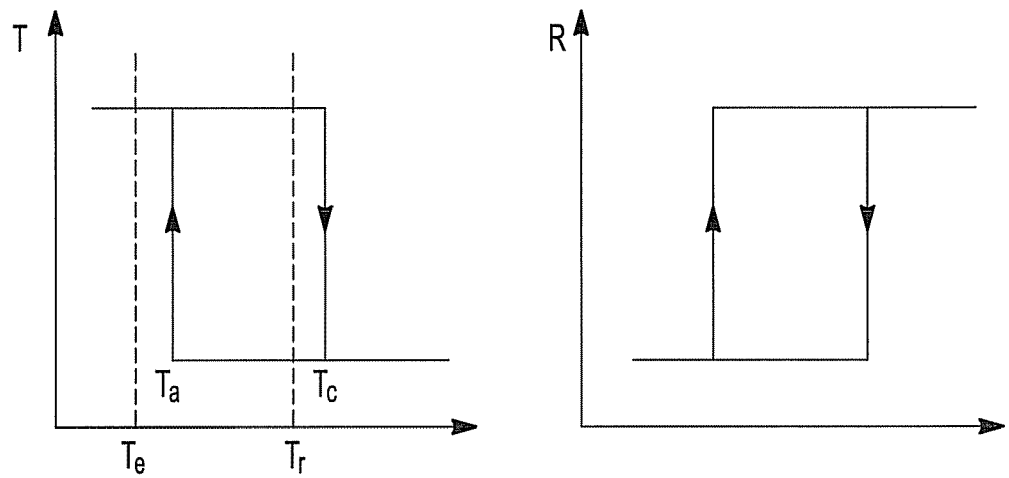
FIG. 1A is a pair of graphs illustrating characteristics of optical reflectivity and transmissivity of an ideal nonvolatile optical memory (NOM) unit according to the principles of the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

In optoelectronics, the ability to store and process a high bandwidth optical signal without having to convert it to the electrical domain may greatly simplify current high speed optical systems. The ability to process signals in the optical domain may also mean that the operating speed will no longer be limited by the electronics devices and that power consumption will be significantly reduced. Optical signal processing based on nonvolatile optical memory units is easily scalable to complex computation without the need for significant additional components.

According to the principles of the present disclosure, optical storage, as well as all-optical signal processing using the optical storage, are possible, neither requiring optical/electric/optical (O/E/O) conversion. In addition, the all-optical storage may be used at interfaces between electrical and optical circuit components where conversion is desired.

An optical memory can be formed using a material that changes from a first state to a second state based upon incident light. The state conversion may be caused by the light heating the material and/or by a non-thermal pathway, such as may be activated by high fluence light (essentially, light having high energy density). To allow for the optical memory to be rewritten, a mechanism for causing the material to revert back to the first state from the second state is implemented.

Hysteresis may allow the material to be stable in the first and second states, such that the material will not revert to the first state once the light source is removed. For various optical memory materials, the reversion to the first state may be caused by decreasing the temperature of the material. If a first temperature needed to cause the first-second conversion is higher than a second temperature needed to cause the second-first conversion, the material can be biased to an intermediate temperature between the first and second temperatures.

By biasing the material to the intermediate temperature, writing can be effected by light heating the material above the first temperature, and erasing can be effected by cooling the material below the second temperature. If neither of these operations is performed, the material may retain its state for a prolonged period of time, if not indefinitely. The optical memory may therefore be referred to as a non-volatile optical memory (NOM).

Because the NOM is biased to the intermediate temperature in order to stably maintain the first and second states, the NOM may be considered not truly non-volatile. However, if the intermediate temperature of the optical material is room temperature, the NOM may appear to be non-volatile, retaining its state after all power is removed (as long as the room stays at room temperature).

Now that data has been stored in the NOM, a mechanism for reading from the NOM is desired. The optical material may exhibit different optical properties in the first and second states. For example, the optical transmissivity and reflectivity may be different. These properties may be detected by shining a test light source on the optical material. Reflected light and/or transmitted light can then be outputted from the NOM. This test light source may have a lower energy than the light used to write the NOM to prevent first-second conversion of the NOM. An optical amplifier may therefore amplify the reflected/transmitted light before it is output from the NOM.

One example of a suitable optical material is vanadium dioxide ($VO_2$), which has reflectivity and transmissivity characteristics as shown in FIG. 1(a). $VO_2$ will be used for illustration purposes only in the detailed description although other materials that exhibit similar properties may be used. Both transmissivity and reflectivity curves exhibit hysteresis versus temperature (with transitions at $T_a$ and $T_c$). The curves may look similar plotted against optical excitation energy when a non-thermal pathway is used to write data.

Initially, the NOM may be in a first RESET state. The NOM unit is biased at a temperature $T_r$, which is below the critical temperature $T_c$. An incoming optical signal, which may represent a binary "1", will change the NOM from the RESET state to a SET state. Because of the hysteresis characteristics, the NOM will remain in the SET state unless an erasure operation is performed to lower the NOM temperature below $T_a$. In various implementations, the RESET state may be a low reflectivity state, while the SET state is a high reflectivity state.

In the RESET state, $VO_2$ may be semiconducting, while in the SET state, $VO_2$ may be metallic. An electrical interface may therefore be connected to the NOM for optical to electrical conversion by detecting the resistivity of the optical material. For example, resistivity may be detected by measuring current flowing in response to an applied voltage. Further, electrical to optical conversion may be performed by causing a transition to the SET state by applying an electrical signal. For example, the electrical signal may heat the $VO_2$ above $T_c$.

Figure 1B:
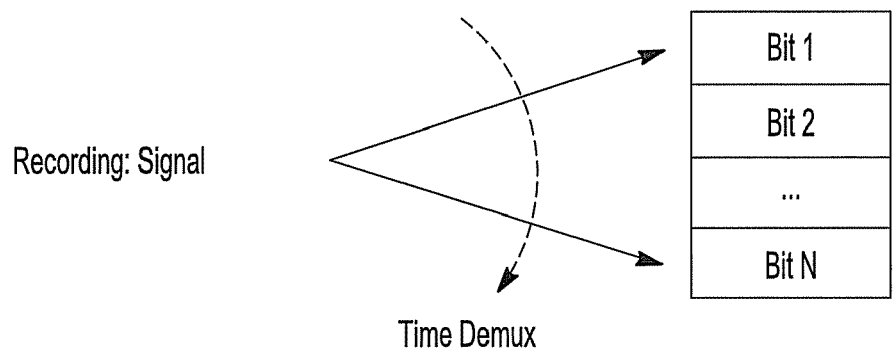
FIG. 1B is a schematic illustrating the operation of NOM as an optical storage device according to the principles of the present disclosure.

FIG. 1(b) depicts how a NOM can be used to optically store more than one bit. If an array of optical material is formed, an incoming light signal can be guided across the array. The incoming light signal is thereby time-demultiplexed across the array. The time variance of the signal's intensity is stored as spatial variance across the array. The array may have one or more dimensions, although for purposes of illustration, it is described herein as having a single dimension.

The incoming light signal can be guided across the optical material array in any suitable fashion. For example only, a cantilevered waveguide may be manipulated to steer the incoming light signal in an arc across a one-dimensional array. The waveguide may be manipulated by a micro-electro-mechanical system (MEMS) actuator, such as a comb drive. For a two-dimensional array, the waveguide may be controlled in a second axis by another MEMS actuator, or by any other actuator. For example only, piezoelectric actuators may be used instead of one or more of the MEMS actuators.

Any other structure, such as a mirror or lens, that can direct a light signal may be controlled to steer the incoming light signal across an optical memory array. In various implementations, the optical memory array may form a circle and the incoming light signal is rotated about the center of that circle.

The light may be directed in discrete steps to focus each bit of the incoming signal on a precise location of the optical memory array. However, this may require precise synchronization of the light's position with the incoming bit stream, which may require conversion of the optical signal to an electrical signal to recover the clock. Further, the large acceleration and deceleration needed to move the light signal for each bit may limit how fast an incoming bit stream can be.

The light signal may be swept continuously across the array. In this case, the NOM may not even be aware of the incoming bit stream speed or encoding (such as Manchester encoding or non-return-to-zero). The incoming light signal will simply be replicated on the optical memory array. The resolution at which the light signal is captured may vary based upon the shortest period of light that will still produce a state transition. Any periods of light shorter than the shortest period will not produce a state transition, and will therefore be lost.

The intensity of the light signal may be considered to be quantized to a 1-bit stream (either the state transition occurred or did not). This may actually serve to remove noise or intensity variation from the incoming light signal. Artifacts of higher intensity light may still be present because the extra energy may cause a slightly wider region to experiences a state transition.

Storage of an incoming light signal has uses in many applications. For example only, an optical buffer may be used in an optical switch. When multiple optical streams are competing for the same output port, one of the streams may be stored in a NOM unit according to the principles of the present disclosure, while the other stream is passed to the output port. The stored stream can then be read out of the NOM unit and passed to the output port.

Figure 2C:
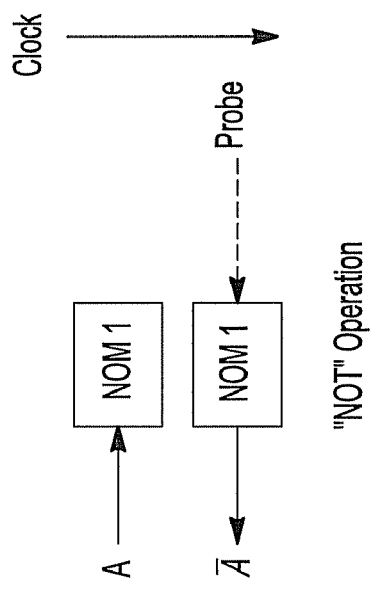
FIGS. 2A-2C are functional examples of operations versus time illustrating three Boolean operations using NOM units according to the principles of the present disclosure.

In addition to storage, the NOM unit may be extended to perform optical signal processing. For example, all three fundamental Boolean operations (NOT, OR and AND) may be achieved, such as is illustrated in FIG. 2, where two NOM units are used. FIG. 2(a) depicts one example of the OR operation, where two signals A and B are stored in a first NOM and a second NOM, respectively. The signals A and B may represent different periods of time of the same optical signal or may be portions of different optical signals altogether.

After the signals A and B are stored, signal A may be read from NOM 1 using a probe signal, and then written to NOM 2. If either signal is a "1" (has enough energy to cause a transition to the SET state), the resulting state will be SET. The optical material of NOM 2 will only remain in the RESET state in areas where neither signal was a "1." This is the definition of a logical OR. The result of the OR operation can then be read from NOM 2 using a probe signal.

As described above, the probe signal that reads out the values from NOM 1 may have an intensity low enough to prevent a state transition. The output of NOM 1 resulting from the probe signal may therefore be amplified to produce enough energy to cause state conversion in NOM 2.

In another example of the OR operation, which may be used when signal B arrives after signal A, signal A may first be written to NOM 1. Signal B is then also written to NOM 1. The resulting information stored in NOM 1 is the logical OR of signals A and B.

In one example of the AND operation, the two signals A and B are written to NOM 1 at the same time. The intensities of the two signals are combined and halved prior to writing, so that there is only enough intensity to cause a state transition when both signals are 1. If only one of the signals is a 1, the resulting intensity will not be quite enough to cause a state transition.

Normally, the optical material may be biased so that a transition from the RESET state to the SET state will occur with 100% intensity, and no transition will occur with 0% intensity. Implementing this type of AND operation may therefore require more precise biasing of the optical material. Specifically, the transition from the RESET state to the SET state will still occur at 100% intensity, but 50% intensity should not cause such a transition. If the bias temperature of the optical material is slightly too high, a 50% intensity may be enough to cause an unwanted transition, turning the AND operation into an OR operation.

Figure 2B:
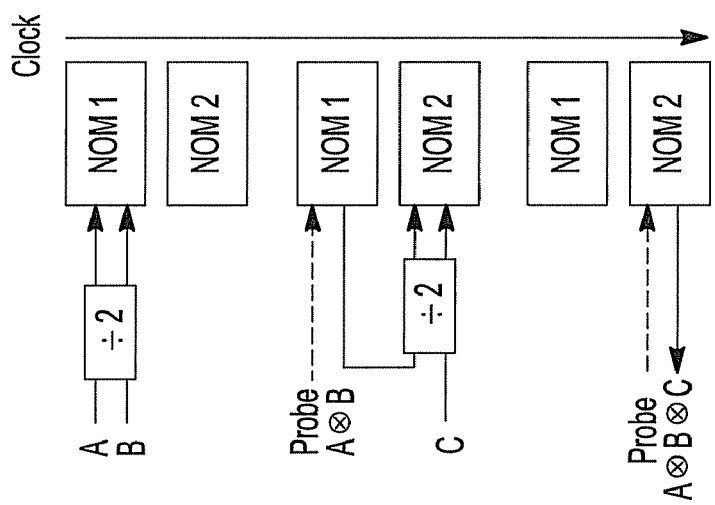
Figure 2A:
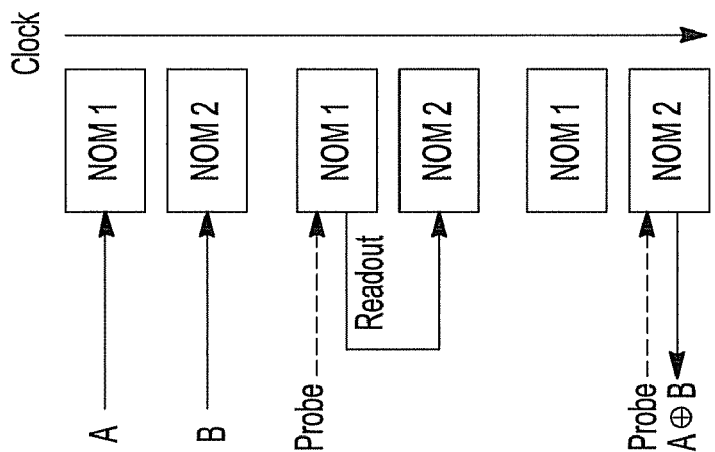

FIG. 2(b) depicts implementing a sequential AND operation with a third signal C by using NOM 2. The result of the AND of signals A and B is now stored in NOM 1. This result can be probed, amplified, and combined with signal C at half intensity to write to NOM 2. NOM 2 therefore includes the result of the logical AND of signals A, B, and C.

FIG. 2(c) depicts an implementation of a NOT operation, where the transmissivity of the optical material is used instead of its reflectivity. Because the transmissivity of the optical material is inverse to its reflectivity, the inverse of a stored signal can be obtained by applying a probe signal to the opposite side of the optical material. This transmittance-based probe can be made on the result of an OR operation or an AND operation, resulting in a NOR operation and a NAND operation, respectively.

Logical operations in the NOM may be based on electrical inputs as well as optical inputs. For example, an OR operation may be performed by writing an electrical signal to NOM 1 before signal A is written to NOM 1. The electronic signal may be written to the NOM by adding a heating element corresponding to each bit location in the NOM. This may require the incoming optical signal to have a predetermined bit rate and encoding type, so that the optical bits will align with the electrical bits.

The operating speed of the NOM may be primarily determined by how fast the $VO_2$ can complete the phase transition. The phase transition in $VO_2$ may be achieved thermally and/or optically. With an excitation of high fluence (i.e. radiation field strength) laser pulses, the phase transition may be governed by a fast non-thermal pathway. For example, the transition time period may be as short as hundreds of femtoseconds (1 E-15 seconds).

This non-thermal pathway may require a laser excitation having a fluence of approximately 10 $mJ/cm^2$ and 0.1 $mJ/cm^2$ for $VO_2$ thin films and $VO_2$ nanoparticles, respectively. For example only, the peak optical power corresponding to the $VO_2$ nanoparticle transition threshold may be around 10 mW for a well focused laser spot coming from a 10 GHz optical information pulse train. Therefore, the required pulse energy is likely low enough for practical on-chip applications.

On the other hand, if the laser pulse does not have a high enough fluence, the phase transition may be governed by a thermal pathway in which the heat is generated from the absorption of light. The transition time depends on the laser pulse energy, the $VO_2$ volume to be heated, and the bias temperature.

To increase the transition speed, the laser pulse energy can be increased, the spot size of the focused laser beam can be decreased, and/or the $VO_2$ film can be biased more closely to (but still below) the transition temperature. The thermal switching time of a $VO_2$ volume of 3 $\mu m^3$ may be less than 10 ns. Reduction of the heating volume may further improve the switching speed. Several strategies to reduce the heating volume, such as a near field technique and a super-resolution mask layer, may also be used.

To estimate the amount of laser pulse energy used to generate enough heat to thermally induce the phase transition, the following parameters may be used: a latent heat L is 1020 cal/mol; a specific heat c is less than 0.5 cal/mol-° C.; a density $\rho$ is 4.25 $g/cm^3$; a molecular weight m is 83 g/mol; and an absorption A in the near infrared range is approximately 25%.

If a volume of the $VO_2$ to heat up is V, the total heat Q required is given by the following equation:

$$Q = \frac{\rho V}{m}(L + c\Delta T),$$

where $\Delta T$ represents the difference between the bias temperature and the critical temperature. Because the specific heat c is very small, the second term ($c\Delta T$) may be ignored. The amount of laser pulse energy required is 4.184*Q/A (joule).

Figure 3:
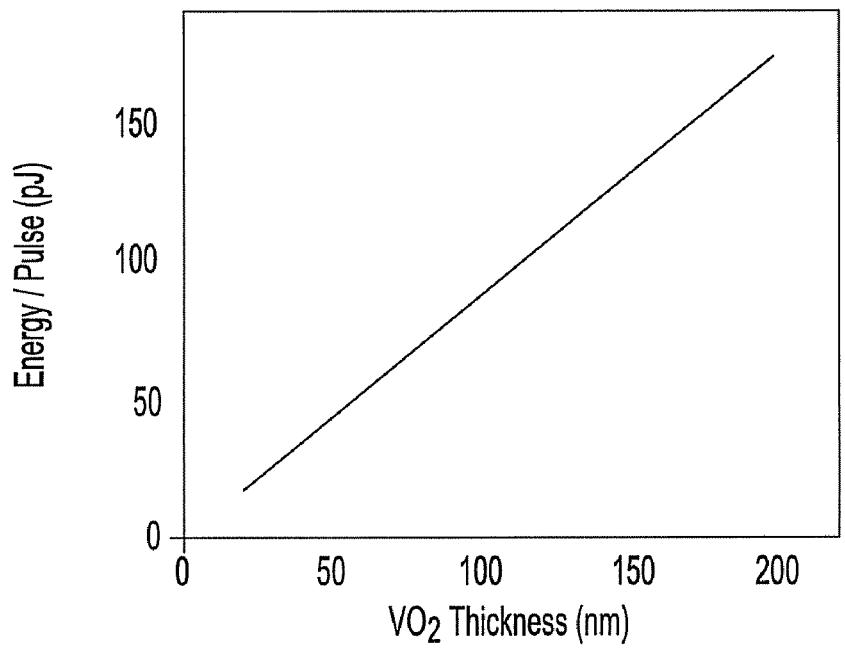
FIG. 3 is a graph illustrating the required pulse energy for a focused laser to induce phase transition in an exemplary $VO_2$ medium according to the principles of the present disclosure.

FIG. 3 shows the required laser pulse energy as a function of $VO_2$ thickness when the focused laser spot is approximately 1 $\mu m_2$ in area. The required energy per signal bit is less than 40 pJ if the $VO_2$ thickness is less than 50 nm. This corresponds to a peak laser power of 100 and 400 mW for 2.5 and 10 Gbit/s optical signals, respectively.

The power requirement may be further reduced by decreasing the $VO_2$ thickness or by reducing the focused laser spot size beyond the diffraction limit. This may be achieved by placing a mask layer within the optical near field zone with respect to the VO$_2$ film. The mask layer may exhibit an intensity-dependent optical transmission that is larger for a higher incident beam intensity.

Figure 4:
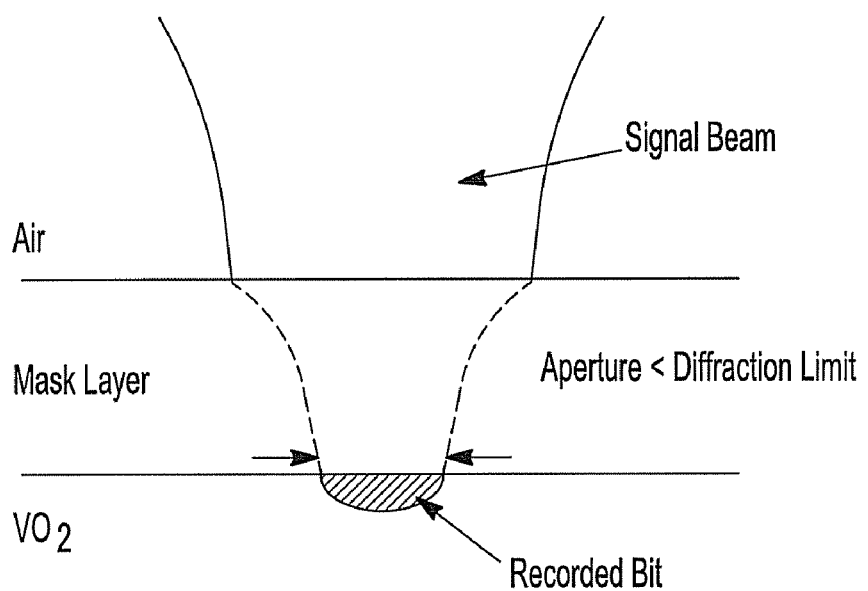
FIG. 4 is a schematic illustrating the use of a mask layer to reduce the laser spot size when accessing an optical medium according to the principles of the present disclosure.

The mask layer may therefore reshape the beam to a smaller dimension. If the VO$_2$ film is placed within the near field zone with respect to the mask layer, the reshaped beam may not propagate and the reduced beam size may be incident on the VO$_2$ film as illustrated in FIG. 4. One example of a suitable mask layer is a saturable absorber (SA). The optical absorption a in an SA is given by the following equation:

$$\alpha = \frac{\alpha_0}{1 + I/I_{sat}},$$

where $\alpha_0$ represents a small signal absorption, $I_{sat}$ represents a saturation intensity, and I represents the intensity of the light beam.

For a focused laser beam, if the intensity at the beam center is much larger than the saturation intensity $I_{sat}$, the beam may be shaped when passing through the SA. The center of the beam may see very little absorption and the tail of the beam may see the small signal absorption $\alpha_0$. By optimizing the thickness of the SA layer, the recording bit size in the VO$_2$ film may be reduced.

One example of a suitable SA material is a lead sulfide (PbS) quantum dot (QD), which may be embedded into the SiO$_2$ glass. In various implementations, the PbS has a saturation intensity of 0.18 MW/cm$^2$ at a wavelength of 1.3 μm, a background absorption of 0.03 cm$^{-1}$, and a small signal absorption of 1.34 cm$^{-1}$.

Within a time scale much less than 100 ps, the PbS SA may relax to its original unsaturated state. This fast relaxation makes PbS suitable for high speed operations. One drawback of the PbS SA is its small $\alpha_0$. Because of the small $\alpha_0$, the normalized beam size reduction is not appreciable. To increase the overall beam size reduction, $\alpha_0$ can be increased. This may be achieved by adjusting the PbS sample preparation conditions or by using a high optical density photorefractive dye polymer.

The recording speed discussed above applies to writing but does not include the time to reset the NOM or read the signal stored in the NOM. In addition, depending on the time demultiplexing mechanism, a period of time may be required during which the scanning mechanism is reset. If a clock is used to synchronize the operations with a different part of a system including the NOM, the operations may be described in terms of clock cycles.

For simplicity of explanation, it is assumed that time demultiplexing of the optical signal is performed by a simple raster beam scanning that routes the optical beam back and forth across a linear VO$_2$ film. In various implementations, the linear VO$_2$ film may actually be curvilinear to maintain a fixed distance between each point on the film and the light source and/or to accommodate the characteristics of focusing lenses. If the capacity of the NOM unit is N bits and the time duration of the raster scan between two adjacent bits is τ, the time required to complete the recording of N bits is N*τ.

Figure 5:
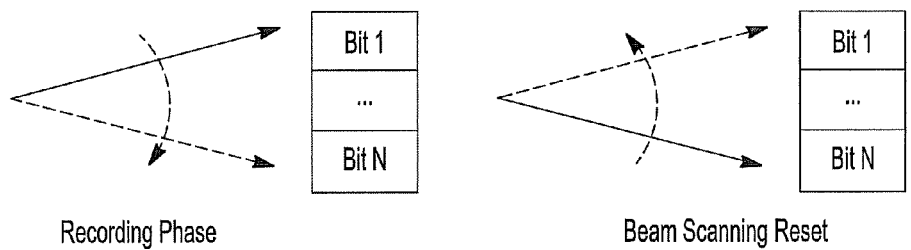
FIG. 5 is a schematic illustrating a busy state after a recording phase to reset the beam scanning back to the origin according to the principles of the present disclosure.

FIG. 5 depicts an exemplary linear optical material, where the top of the material is defined to be bit 1 and the bottom of the material is defined to be bit N. The lines shown between individual bits in FIG. 5 may represent general boundaries between bits if the received optical signal is written continuously across the optical material.

As the optical signal is received, the beam is moved downward, writing a time period of the optical signal corresponding to N bits across the optical material. At the end of the recording cycle, the beam is directed at the bottom of the optical material (bit N). In order to read out the signal, the scanning mechanism returns back to the top of the optical media so that the data can be read in the order it was written. Returning the scanning mechanism from bottom to top may require the same amount of time as moving the scanning mechanism from top to bottom. Although the return may be performed more quickly, there may be practical problems in changing between two different speeds.

The time for the storage operation may be defined as one clock cycle, and may be equal to N*τ. The readout operation may require the same amount of time as the storage operation. Therefore, completing the storage and readout takes a minimum of three clock cycles. AND and NOT operations are performed in the same sequence, with a storage operation, a retrace operation, and a readout operation.

Figure 6:
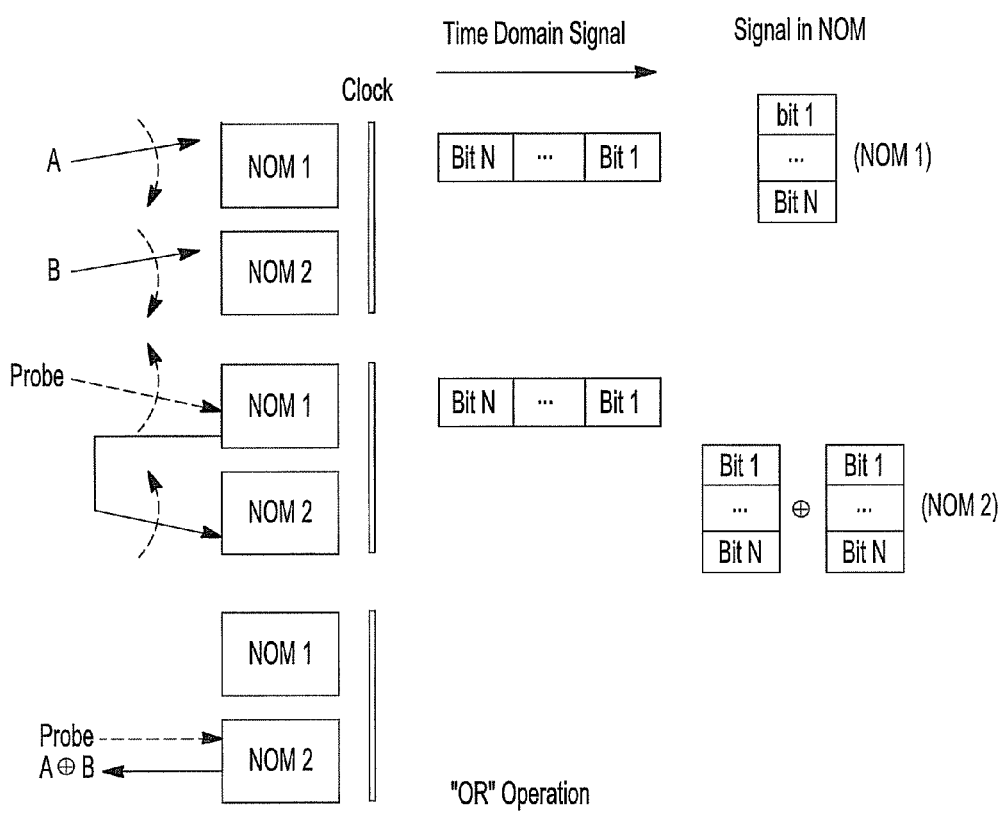
FIG. 6 is a schematic illustrating an OR operation using an exemplary NOM architecture according to the principles of the present disclosure.

FIG. 6 depicts one implementation of an OR operation where signals A and B are received simultaneously. During clock cycle 1, the beam scans from top to bottom as signals A and B are stored in NOM 1 and NOM 2, respectively. At the end of clock cycle 1, signals A and B have been stored into NOM 1 and NOM 2, respectively.

In clock cycle 2, the beam scans from bottom to top as information is retrieved from NOM 1 and recorded into NOM 2. NOM 1 and NOM 2 may be connected by a waveguide that routes light from NOM 1 to NOM 2. An amplifier may be present to amplify the probe signal reflected from NOM 1 to have enough power to cause state transitions in NOM 2. Further, a circulator may be used to minimize light lost in routing light from NOM 1 to NOM 2. At the end of clock cycle 2, the OR operation is complete and the beam is back at the top. There is therefore no need to retrace the beam back to the top. The result of the OR operation can therefore be read out in clock cycle 3.

The following table summarizes the above results for the number of clock cycles used in each step of the storage operation and the three fundamental Boolean operations:

| # of clock cycles | Computation | Beam scanning reset | Read out |
|---|---|---|---|
| Identity (storage) | 1 | 1 | 1 |
| OR | 2 | 0 | 1 |
| AND | 1 | 1 | 1 |
| NOT | 1 | 1 | 1 |

The values for OR and AND are the same as for NOR and NAND where the data is read out as with the NOT operation.

From the above table, each operation using the presently disclosed architecture will require two clock cycles to complete before data can be read out. Therefore, the system speed is half of the signal bit rate. That means that a 40 Gbit/s optical signal can be processed at 20 Gbit/s. Multiple NOMs or sets of NOMs may therefore be used to allow full line rate processing.

Figure 1B:
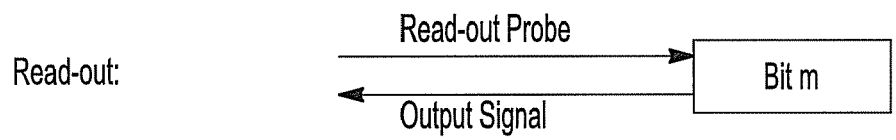

When two or more operations are sequenced, an additional time slot to RESET one of the NOMs may be required. The reset time in VO$_2$ is the time required to dissipate the heat into the heat sink such that the temperature can be lowered below $T_a$, as indicated in FIG. 1. Normally, it only takes approximately several tens of nanoseconds due to the small specific heat c of VO$_2$. This time is less than a clock cycle if N=250 and τ=400 ps. However, if the specific heat c of the heat sink is greater than that of VO$_2$, the RESET time may be limited by the heat sink dissipation.

Figures 7, 8:
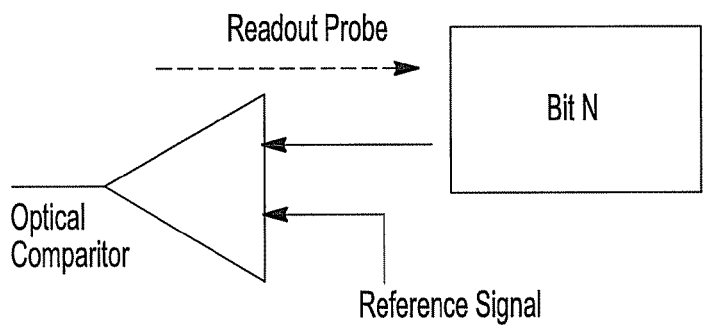
FIG. 7 is a schematic illustrating an AND operation followed by an OR operation using an exemplary NOM architecture according to the principles of the present disclosure.
FIG. 8 is a functional block diagram illustrating use of an optical comparator to improve signal-to-noise ratio (SNR) according to the principles of the present disclosure.

If the first operation in a series is an OR, NOM 1 will need to be erased before another operation can be performed using NOM 1. However, this is not the case if the first operation is an AND operation. For example, FIG. 7 illustrates the details of an AND operation followed by an OR operation. In the following table, four possible sequences for two consecutive Boolean operations are illustrated.

| # of clock cycles | computation | beam scanning reset | intermediate reset | readout |
|---|---|---|---|---|
| OR → OR | 4 | 0 | 1 | 1 |
| OR → AND | 3 | 1 | 1 | 1 |
| AND → OR | 2 | 2 | 0 | 1 |
| AND → AND | 2 | 2 | 0 | 1 |

In this example, for sequential operations, the average system speed is (4+5)/2/2=2.25 clock cycles if equal probabilities of AND and OR operations are assumed. For example, for a 40 Gbit/s optical signal, the average speed to processing rate is 40 Gbit/s/2.25=18 Gbit/s. In various implementations, some sequences may be optimized. For example only, in FIG. 7, NOM 1 may be probed, and NOM 2 written with the results, in clock cycle 2 instead of 3. This may allow the readout to occur in clock cycle 3 instead of clock cycle 5.

The total capacity of the NOM unit may be determined by how much scanning range may be achieved and a minimum recording bit size in the $VO_2$ film. For example, in a linear scanning example, the linear scanning velocity is S cm/sec and the minimum recording bit size is y nm. A maximum signal bit rate B that can be handled by the NOM may be determined by:

$$B(Gbit/s) = \frac{100 \cdot S \text{ (cm/s)}}{y \text{ (nm/bit)}}.$$

Without reducing the focused beam size beyond the diffraction limit, the linear scanning velocity S may need to be 25 cm/s to handle an optical signal with a bit rate greater than 2.5 Gbit/s. If the scanning range is given by z cm, the total capacity of the NOM unit then becomes:

$$N(Gbit) = \frac{100 \cdot z \text{ (cm)}}{y \text{ (nm/bit)}}.$$

When recording, if two adjacent bits are not the same, it is possible to have heat dissipation from the bit "1" location into the bit "0" location. This may increase the temperature of the bit "0" location. If the bias temperature is far below from the critical temperature, the amount of temperature increase in the bit "0" location may not be enough to induce a phase transition, and therefore there will be no interference between two adjacent bits.

However, if the bias temperature is close to the critical temperature and if the temperature rise at the bit "0" location exceeds the transition temperature, the region at the boundary between two adjacent bits may experience phase transition. If this occurs, a signal-to-noise ratio (SNR) for the bit "0" information may be reduced. Because energy essentially bleeds over from "1" locations to "0" locations, and not the converse, this may have no affect on the SNR of "1" information.

The main component of the SNR comes from contrast, such as reflectivity or transmissivity, during the readout process. In $VO_2$ thin film, a change in reflectivity percentage in the near-infrared range is approximately 15-20, with a reflectivity contrast $\Delta R/R$ of approximately 50%. The contrast may be greatly enhanced by using $VO_2$ nanoparticles, possibly due to surface plasmonic enhancement. However, the actual contrast improvement may be smaller due to small volume filling of the $VO_2$ nanoparticles. Optimization of the design will yield the highest SNR.

FIG. 8 depicts an exemplary system for enhancing SNR by passing the readout signal through an optical comparator. The optical comparator may increase the overall system complexity and cost. The optical comparator may be implemented by using a bistable diode laser or a coupled nonlinear micro-ring array. One input of the comparator receives the signal read from the optical material by a probe signal. The other input of the comparator may be fixed at a level corresponding to a reflectivity in between the reflectivities of the first and second states of the optical material.

In addition to $VO_2$, other materials may exhibit suitable properties for use according to the principles of the present disclosure. For example only, chalcogenides such as $Ge_2Se_2Te_5$ may be suitable choices for optical materials. As a further example, the insulator-to-metal transition in a halogen-bridged nickel-chain compound is ultra-fast and exhibits a reflectivity contrast $\Delta R/R$ of approximately 260%.

Figure 9:
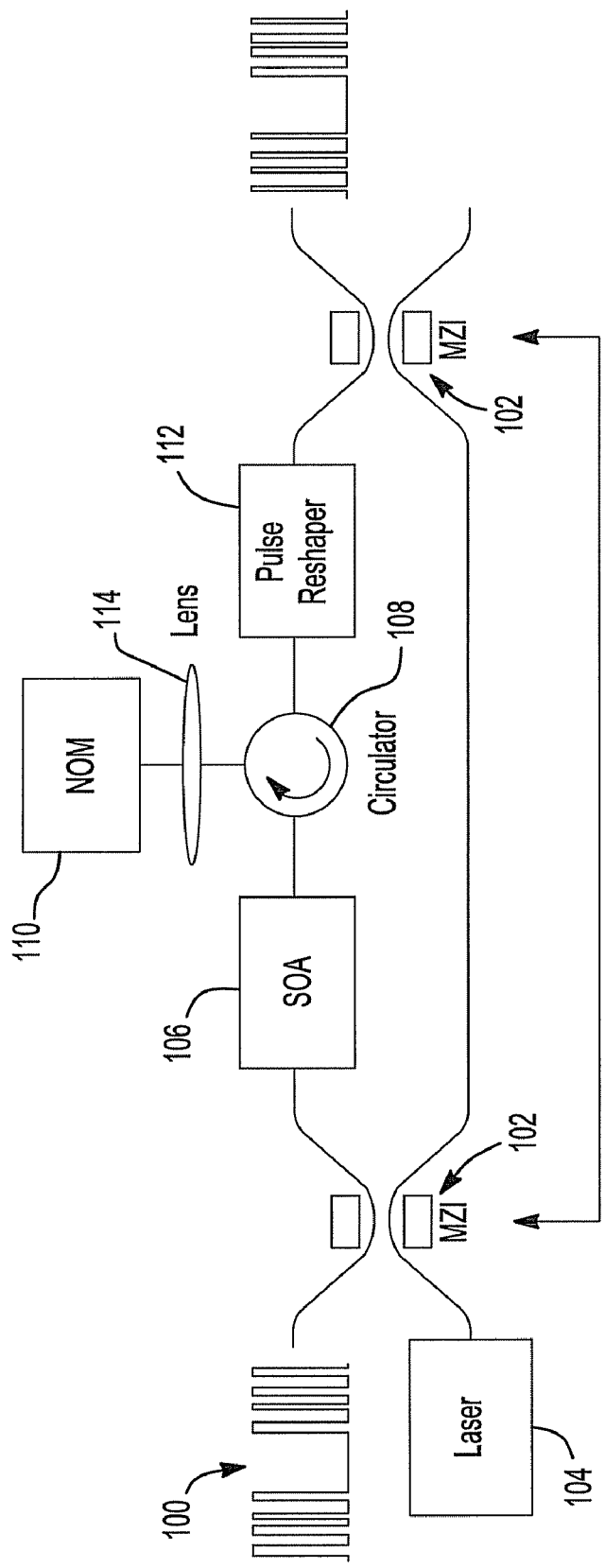
FIG. 9 is a functional block diagram illustrating an exemplary NOM system architecture according to the principles of the present disclosure.
Figure 10:
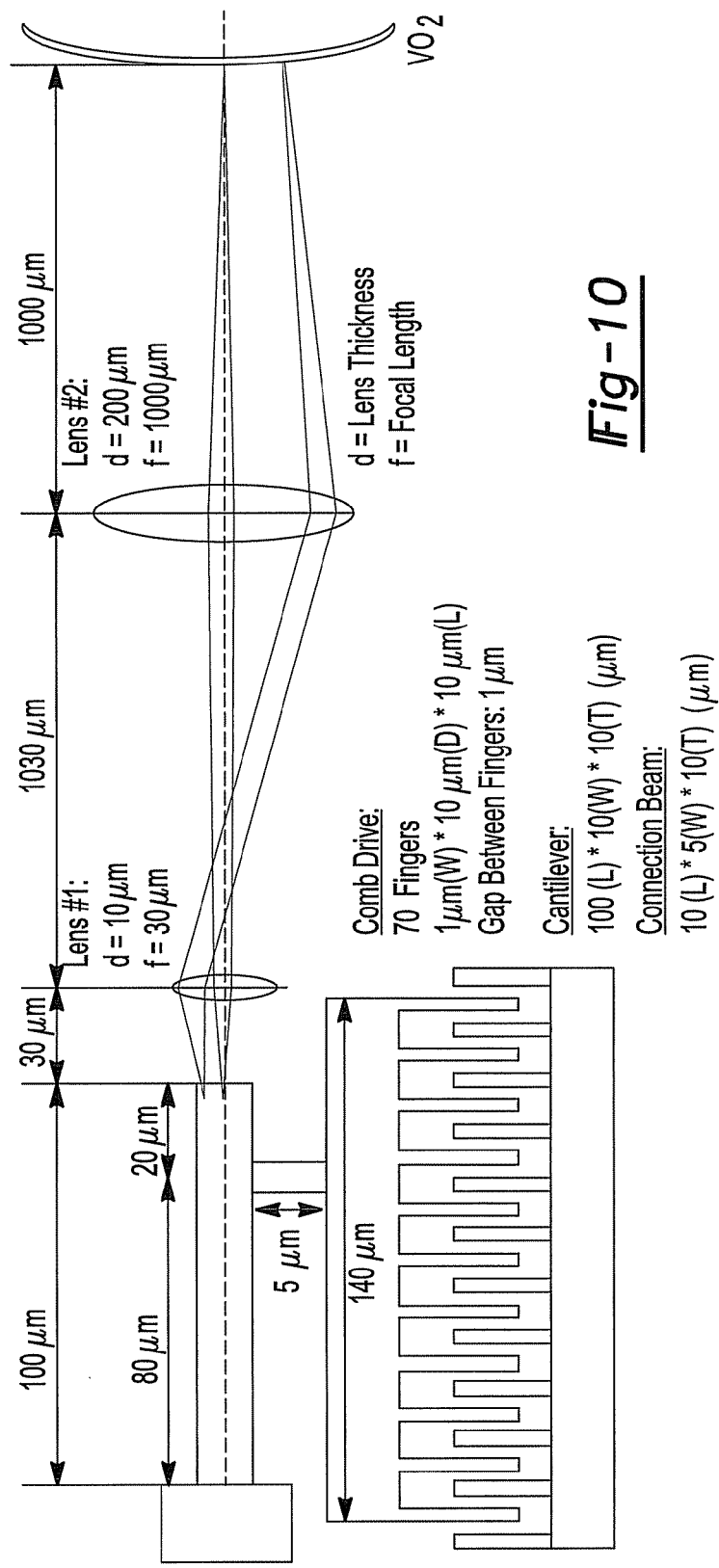
FIG. 10 is a schematic illustrating a beam scanning mechanism using a micro-electro-mechanical system (MEMS) cantilever waveguide actuated by a comb drive according to the principles of the present disclosure.
Figure 11A:
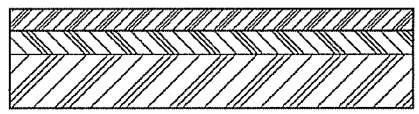
FIG. 11 is a diagram illustrating exemplary process steps for fabrication of a lens module according to the principles of the present disclosure.
Figure 11B:
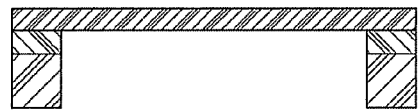
Figure 11C:
Figure 11D:
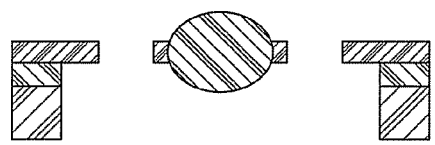
Figure 11E:
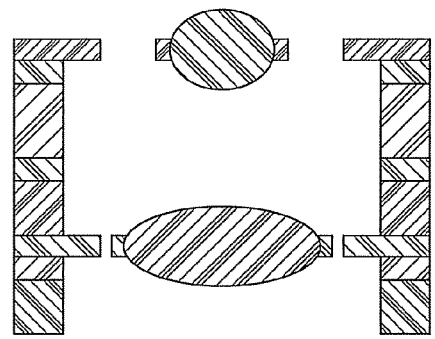

FIG. 9 depicts a functional block diagram of a single-bit NOM system. Such a unit may be used to perform one-bit optical signal storage and processing. The single-bit NOM system is shown for purposes of illustration only, and FIG. 10 depicts one way of applying the principles of FIG. 9 to a multiple-bit NOM.

An incoming optical signal is represented graphically at 100. A Mach-Zehnder interferometer (MZI) 102 is used to switch between the incoming optical signal 100 and a laser probe 104 for reading out data. A semiconductor optical amplifier (SOA) 106 is used to amplify the signal level if necessary to induce the phase transition. A circulator 108 directs light from the SOA 106 to a single-bit NOM 110 and directs light from the NOM 110 to an optional pulse reshaper 112. The pulse re-shaper 112 is used to improve the SNR.

A lens 114 or lens array (not shown) may be placed between the circulator 108 and the NOM 110 to focus the light onto a certain area of the NOM 110. The NOM 110 may include a film, such as a $VO_2$ film, whose temperature is controlled by a thermoelectric (TE) cooler (not shown). The TE cooler allows the NOM 110 to actively be cooled to convert the optical material from the SET state to the RESET state. In some applications, passive cooling may be performed by simply removing the source of the bias heat. The NOM 110 may be cooled as a single unit or portions of the NOM 110 may be cooled individually.

For testing purposes, the incoming optical signal 100 may be generated by a diode laser single pulse generator (not shown) having a low repetition rate, such as less than a few kHz. The laser probe 104 may also be generated from the same pulse generator, but with a delay with respect to the signal pulse of more than 1 µs. The output of the pulse generator may be attenuated when serving as the laser probe 104 to avoid inducing phase transitions while reading.

Since the resistivity of $VO_2$ changes by at least four orders of magnitude when phase transition occurs, it is possible to directly convert the optical information stored in the NOM unit to an electronic signal by detecting the current flowing through each bit with an externally biased voltage. A voltage greater than a certain voltage, such as 20 V, should not be applied because a different phase transition mechanism may occur (for example, a Mott first-order metal-insulator transition). This optical-electronic interface may be very useful in optoelectronic integration applications.

FIG. 10 depicts a schematic of one implementation of a multi-bit NOM according to the principles of the present disclosure. The multi-bit NOM of FIG. 10 may be substituted for the NOM 110 and lens 114 in FIG. 9. In various implementations, some or all of the components in FIGS. 9 and 10 may be integrated on a single chip using hybrid integration.

If an array of optical material is created, the incoming light beam can be traced across the array. There are a variety of beam scanning techniques available. One possibility is to use a silicon micro-electro-mechanical system (MEMS) fabrication. For example only, the beam scanning may be achieved by a simple cantilever waveguide actuated by a comb drive, as shown in FIG. 10.

According to the equation $$B(Gbit/s) = \frac{100 \cdot S \text{ (cm/s)}}{y \text{ (nm/bit)}},$$

for a given recording bit size y, the maximum bit rate of the optical signal the NOM can handle is linearly proportional to the scanning velocity S. Using the dimensions shown in FIG. 10, which have been numerically simulated using ANSYS, an oscillation frequency of the cantilever and comb drive combination may exceed 1 MHz when the drive voltage is around 800 V. This voltage can be produced at the desired frequency by commercial sources.

From the numerical simulation, the total storage capacity of one implementation is at least 250 bits at a signal bit rate of 2.5 Gbit/s. If super-resolution techniques are exploited, the capacity may improve. The comb drive may include 35 fingers on each of two combs, each finger of width 1 μm, depth 10 μm, and length 10 μm. The fingers on one comb may be separated from adjacent fingers on the other comb by 1 μm.

The cantilevered waveguide may be 100 μm in length, 10 μm wide, and 10 μm tall. A connection beam may attach the comb drive to the cantilever at a point 80% along the length of the cantilevered waveguide away from its hinge point. The connection beam may be 10 μm long, 5 μm wide, and 10 μm tall.

First and second lenses may focus light from the cantilevered waveguide onto the optical memory, which is shown as $VO_2$ in FIG. 10. The first lens may be located 30 μm from the end of the cantilevered waveguide, have a thickness of 10 μm, and a focal length of 30 μm. The second lens may be located 1030 μm from the first lens, have a thickness of 200 μm, and a focal length of 1000 μm. The distance from the second lens to the optical material may be 1000 μm.

FIG. 11 depicts an exemplary method of producing a lens system, such as the two-lens system described with respect to FIG. 10. The laser beam exiting the cantilevered waveguide may disperse in the plane of FIG. 10 as well as normal to that plane. In order to focus the laser beam coming out of the cantilever waveguide to the $VO_2$ medium, a three-dimensional silicon lens fabrication may be adopted.

Both lenses may be fabricated separately using silicon-on-insulator (SOI) wafers. The two lenses may then be fused together, creating a two-lens module that can be placed onto the beam scanning platform. For example only, the plane of FIG. 10 may represent the surface of a substrate. The two-lens module will then be rotated so that the lenses are perpendicular to the plane of FIG. 10.

To position the two-lens module precisely, grooves (for example, about 700-800 μm wide) may be etched on the beam scanning platform such that the lens module may be aligned to the correct position. The lens may be a polymer lens formed by surface tension and cured by UV exposure. The curvature of the lens surface, and therefore the focal length, may be controlled by the aperture dimension where the polymer is hanged.

For example only, similar to the lens integration, a thin film $VO_2$ may be fabricated on a $SiO_2$ substrate first and then placed onto the beam scanning platform. The temperature controlling device (for example, a TE cooler), may be attached to the side of the $SiO_2$ substrate to make direct contact with the $VO_2$. Alternatively, $VO_2$ may be deposited directly on the beam scanning platform and reactive ion etching (RIE) dry etching may be performed to define the vertical recording plane. In the latter approach, metal leads may be deposited that connect the $VO_2$ to the heat sink and the TE cooler.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. An optical memory comprising:
an array of optical material, wherein the optical material assumes first and second states, and wherein incident light causes the optical material to transition from the first state to the second state;
a beam scanning device that selectively directs a received optical data signal across the array of optical material; and
an amplifier that selectively amplifies the received optical data signal to a first intensity, wherein the first intensity is sufficient to cause the transition.

2. The optical memory of claim 1 wherein the optical material comprises at least one of vanadium dioxide, $Ge_2Se_2Te_5$, and a halogen-bridged nickel-chain compound.

3. The optical memory of claim 1 wherein incident light causes the transition by one of heating of the optical material and a non-thermal pathway.

4. The optical memory of claim 1 wherein the optical material transitions from the second state to the first state when cooled to a first temperature.

5. The optical memory of claim 4 further comprising a heating element that biases the array of optical material to a temperature higher than the first temperature.

6. The optical memory of claim 4 further comprising a thermoelectric cooler that selectively cools the optical material.

7. The optical memory of claim 1 further comprising a probe signal generator that generates a probe light source having an intensity less than the first intensity.

8. The optical memory of claim 1 further comprising a probe signal generator that generates a probe light source that is selectively applied to the array of optical material by the beam scanning device.

9. The optical memory of claim 8 wherein light resulting from the probe light source one of reflecting from and passing through the array of optical material is output from the optical memory.

10. The optical memory of claim 1 further comprising a lens that focuses the received optical data signal from the beam scanning device onto the array of optical material.

11. An optical memory comprising:
an array of optical material, wherein the optical material assumes first and second states, and wherein incident light causes the optical material to transition from the first state to the second state; and
a beam scanning device that selectively directs a received optical data signal across the array of optical material,
wherein the beam scanning device comprises a waveguide attached at a first end and an actuation device that changes a position of a second end of the waveguide, wherein the waveguide selectively receives the received optical data signal at the first end.

12. The optical memory of claim 11 wherein the beam scanning device further comprises a lens module that focuses the received optical data signal from the waveguide onto the array of optical material.

13. The optical memory of claim 12 wherein the lens module comprises two lenses.

14. The optical memory of claim 12 wherein the actuation device comprises a micro-electro-mechanical system (MEMS) device.

15. The optical memory of claim 14 wherein the MEMS device comprises a comb drive that is attached to the waveguide between the first and second ends of the waveguide.

16. The optical memory of claim 1 wherein the optical material has a different transmissivity in the first and second states and a different reflectivity in the first and second states.

17. The optical memory of claim 1 further comprising a heating element that heats a portion of the array of optical material based on a received electrical signal.

18. The optical memory of claim 1 further comprising a resistance measurement device that measures a resistance of a portion of the array of optical material and generates an electrical signal based on the resistance, wherein the optical material has a different resistance in the first and second states.

19. An optical computation system comprising:
a first optical memory comprising:
an array of optical material, wherein the optical material assumes first and second states, and wherein incident light causes the optical material to transition from the first state to the second state; and
a beam scanning device that selectively directs a received optical data signal across the array of optical material; and
a second optical memory, wherein information stored in the first optical memory is selectively written to the second optical memory to perform a logical or operation.

20. An optical computation system comprising:
a first optical memory comprising:
an array of optical material, wherein the optical material assumes first and second states, and wherein incident light causes the optical material to transition from the first state to the second state; and
a beam scanning device that selectively directs a received optical data signal across the array of optical material; and
an optical divider that generates the received optical data signal by combining and dividing first and second optical data signals.

21. An integrated circuit comprising:
an array of optical material, wherein the optical material assumes first and second states, and wherein incident light causes the optical material to transition from the first state to the second state; and
a beam scanning device comprising:
a waveguide having a fixed first end and a movable second end, wherein a received optical data signal enters the waveguide at the first end;
a micro-electro-mechanical system (MEMS) comb drive that is attached to the waveguide between the first and second ends and that selectively directs the optical data signal across the array of optical material; and
a lens module that focuses the optical data signal from the waveguide onto the array of optical material.

* * * * *

UNITED STATES PATENT AND TRADEMARK OFFICE
CERTIFICATE OF CORRECTION

PATENT NO. : 7,995,878 B2  Page 1 of 1
APPLICATION NO. : 12/193257
DATED : August 9, 2011
INVENTOR(S) : Pei-Cheng Ku et al.

It is certified that error appears in the above-identified patent and that said Letters Patent is hereby corrected as shown below:

Column 3, line 55, "FIG. 1(a)" should be --FIG. 1A--.

Column 4, line 15, "FIG. 1(b)" should be --FIG. 1B--.

Column 4, line 61, "experiences" should be --experience--.

Column 5, line 8, "FIG. 2(a)" should be --FIG. 2A--.

Column 5, line 50, "FIG. 2(b)" should be --FIG. 2B--.

Column 5, line 56, "FIG. 2(c)" should be --FIG. 2C--.

Column 6, line 60, "$\mu m_2$" should be --$\mu m^2$--.

Column 7, line 10, "a" should be --$\alpha$--.

Signed and Sealed this
Fourth Day of October, 2011

David J. Kappos
*Director of the United States Patent and Trademark Office*